(12) United States Patent
Das et al.

(10) Patent No.: US 8,063,315 B2
(45) Date of Patent: Nov. 22, 2011

(54) CIRCUITIZED SUBSTRATE WITH CONDUCTIVE PASTE, ELECTRICAL ASSEMBLY INCLUDING SAID CIRCUITIZED SUBSTRATE AND METHOD OF MAKING SAID SUBSTRATE

(75) Inventors: Rabindra N. Das, Vestal, NY (US); Kostas I. Papathomas, Endicott, NY (US); Voya R. Markovich, Endwell, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 1141 days.

(21) Appl. No.: 11/802,434

(22) Filed: May 23, 2007

(65) Prior Publication Data

US 2007/0221404 A1  Sep. 27, 2007

Related U.S. Application Data

(63) Continuation-in-part of application No. 11/244,180, filed on Oct. 6, 2005, now Pat. No. 7,442,879.

(51) Int. Cl.
*H05K 1/11* (2006.01)

(52) U.S. Cl. ........................................ 174/262; 361/792

(58) Field of Classification Search .......... 174/262–266; 361/792–795
See application file for complete search history.

(56) References Cited

U.S. PATENT DOCUMENTS

| | | |
|---|---|---|
| 4,775,439 A | 10/1988 | Seeger, Jr. et al. |
| 5,538,789 A | 7/1996 | Capote et al. |
| 5,565,267 A | 10/1996 | Capote et al. |
| 5,882,722 A | 3/1999 | Kydd |
| 5,891,283 A | 4/1999 | Tani et al. |
| 6,036,889 A | 3/2000 | Kydd |
| 6,120,708 A | 9/2000 | Ohshita et al. |
| 6,174,589 B1 * | 1/2001 | Kawakita et al. ............. 428/209 |
| 6,623,663 B2 | 9/2003 | Oshita et al. |
| 6,641,898 B2 * | 11/2003 | Yazaki et al. ................. 428/209 |
| 6,740,287 B2 | 5/2004 | Billiet et al. |
| 6,743,319 B2 | 6/2004 | Kydd |
| 6,762,496 B2 | 7/2004 | Yamamoto et al. |
| 6,809,269 B2 | 10/2004 | Fuller, Jr. et al. |
| 6,815,837 B2 | 11/2004 | Alcoe |
| 6,828,514 B2 | 12/2004 | Chan et al. |

* cited by examiner

*Primary Examiner* — Jeremy Norris
(74) *Attorney, Agent, or Firm* — Mark Levy; Lawrence R. Fraley; Hinman, Howard & Kattell

(57) ABSTRACT

A circuitized substrate which includes a conductive paste for providing electrical connections. The paste, in one embodiment, includes a metallic component including nano-particles and may include additional elements such as solder or other metal micro-particles, as well as a conducting polymer and organic. The particles of the paste composition sinter and, depending on what additional elements are added, melt as a result of lamination to thereby form effective contiguous circuit paths through the paste. A method of making such a substrate is also provided, as is an electrical assembly utilizing the substrate and including an electronic component such as a semiconductor chip coupled thereto.

17 Claims, 3 Drawing Sheets

CIRCUITIZED SUBSTRATE WITH CONDUCTIVE PASTE, ELECTRICAL ASSEMBLY INCLUDING SAID CIRCUITIZED SUBSTRATE AND METHOD OF MAKING SAID SUBSTRATE

CROSS REFERENCE TO CO-PENDING APPLICATIONS

In Ser. No. 11/177,442, filed Jul. 11, 2005, there is defined a circuitized substrate which includes a high temperature dielectric material in combination with a low temperature conductive paste, the paste including an organic binder component and at least one metallic component. The flakes of the metallic component are sintered to form a conductive path through the dielectric when the dielectric is used as a layer in the substrate. Ser. No. 11/177,442 is assigned to the same Assignee as the present invention.

In Ser. No. 11/177,413, also filed Jul. 11, 2005, there is defined a method of making a circuitized substrate which includes a high temperature dielectric material in combination with a low temperature conductive paste, the paste including an organic binder component and at least one metallic component. In this method, the flakes of the metallic component are sintered to form a conductive path through the dielectric when the dielectric is used as a layer in the substrate. Ser. No. 11/177,413 is also assigned to the same Assignee as the present invention.

In Ser. No. 11/244,180, filed Oct. 6, 2005, there is defined a circuitized substrate which includes a conductive paste for providing electrical connections. The paste, in one embodiment, includes a binder component and at least one metallic component including micro-particles. In another embodiment, the paste includes the binder and a plurality of nano-wires. Selected ones of the micro-particles or nano-wires include a layer of solder thereon. A method of making such a substrate is also provided, as are an electrical assembly and information handling system adapter for having such a substrate as part thereof. Ser. No. 11/244,180 is a continuation-in-part of Ser. No. 11/177,442 and is assigned to the same Assignee as the present invention.

The present application is a continuation-in-part of Ser. No. 11/244,180 filed Oct. 6, 2005 now U.S. Pat. No. 7,442,879.

TECHNICAL FIELD

This invention relates to circuitized substrates and particularly to those used in multilayered circuit boards, chip carriers, and the like, and to processes for manufacturing same. More particularly, the invention relates to such substrates in which conductive pastes are used for form electrical connections therein, e.g., between conductors on different conductive layers within the substrate, as well as within conductive thru-holes if so utilized. Even more particularly, the invention relates to such substrates which are comprised of organic dielectric materials compared to non-organic materials such as ceramic.

BACKGROUND OF THE INVENTION

Responsive to the demands for miniaturization in many of today's circuitized substrate designs, multilayered printed circuit boards (PCBs), laminate chip carriers, and the like organic products require formation of multiple circuits in a minimum volume or space. These typically comprise a stack of electrically conductive layers of signal, ground and/or power planes (lines) separated from each other by a layer of organic dielectric material. Selected lines or pads of one conductive layer are often in electrical contact with selected ones of lines and/or pads of other conductive layers using plated holes passing through the dielectric layers. The plated holes are often referred to as "vias" if internally located, "blind vias" if extending a predetermined depth within the board from an external surface, or "plated-thru-holes" (PTHs) if extending substantially through the board's full thickness. By the term "thru-hole" as used herein is meant to include all three types of such conductive openings.

Fabrication of such PCBs, chip carriers and the like typically require the formation of separate inner-layer circuits (circuitized layers), which are often made by coating a photosensitive layer or film (often referred to simply as photoresist) over a copper layer of a copper clad inner-layer base material. The organic photosensitive coating is imaged, developed and the exposed copper is etched to form conductor lines. After etching, the photosensitive film is stripped from the copper leaving the circuit pattern on the surface of the inner-layer base material. This processing is also referred to as photolithographic processing in the PCB art and further description is not deemed necessary. Following the formation of individual inner-layer circuits, a multilayer stack is formed by preparing a lay-up of inner-layers, ground planes, power planes, etc., typically separated from each other by a dielectric, organic pre-preg typically comprising a layer of glass (typically fiberglass) cloth impregnated with a partially cured material, typically a B-stage epoxy resin. Such an organic material is also referred to in the industry as "FR-4" dielectric material. The top and bottom outer layers of the stack usually comprise copper clad, glass-filled, epoxy planar substrates with the copper cladding comprising exterior surfaces of the stack. The stack is laminated to form a monolithic structure using heat and pressure to fully cure the B-stage resin. The stack so formed typically has metal (usually copper) cladding on both of its exterior surfaces. Exterior circuit layers are formed in the copper cladding using procedures similar to the procedures used to form the inner-layer circuits. A photosensitive film is applied to the copper cladding. The coating is exposed to patterned activating radiation and developed. An etching solution such as cupric chloride is then used to remove copper bared by the development of the photosensitive film. Finally, the remaining photosensitive film is removed, leaving the desired circuit layers on the external surfaces.

As is known, conductive thru-holes (or interconnects) serve to electrically connect individual circuit layers within the structure to each other and to the outer surfaces and typically pass through all or a portion of the stack. Thru-holes may be formed prior to the formation of circuits on the exterior surfaces by drilling holes through the stack at appropriate locations. Alternatively, such holes may be formed within the individual circuitized layers prior to incorporation within the multi-layered structure and final lamination thereof. In both methods, the bare walls of these holes are usually subjected to at least one pre-treatment step after which the walls are catalyzed by contact with a plating catalyst and metallized, typically by contact with an electro-less or electrolytic copper plating solution. If the thru-holes are PTHs, interconnections are thus formed between selected ones of the circuitized layers of the multilayered final product which have one or more conductive lines or elements in contact with the inner conductive layer of the PTHs. If the thru-holes are individually formed within selected layers and then coupled to one another during product stacking, connectivity is accomplished preferably using a conductive paste or the like. (It is also known to use such pastes in PTHs as described above, including in combination with the plated walled versions thereof.) Such conductive pastes are known to include a highly conductive metal such as silver in the form of flakes. Following formation of the conductive thru-holes in multi-layered structures such as PCBs in which the thru-holes are provided as PTHs, exterior circuits (outer-layers) are formed using the procedure described above. Such external formation may also occur when stacking layers already having thru-holes formed therein. It is also possible to form the two outer conductive layers, and then stack the layered sub-composites together.

In typical substrate construction, semiconductor chips and/or other electrical components are mounted at appropriate locations on the exterior circuit layers of the multilayered stack after construction of the substrate having such connections therein has been accomplished. In some examples, such components are mounted and electrically coupled using solder ball technology, one form of which is referred to in the industry as ball grid array (BGA) technology. For PCBs, these components may include capacitors, resistors, and even chip carriers. For chip carriers having multilayered substrates, a chip is often solder bonded to the carrier laminate substrate's upper surface and the carrier is in turn solder bonded to an underlying substrate, typically a PCB. In either form (PCB or chip carrier), the components are in electrical contact with the circuits within the structure through the conductive thru-holes, as desired. The solder pads are typically formed by coating an organic solder mask coating over the exterior circuit layers. The solder mask may be applied by screen coating a liquid solder mask coating material over the surface of the exterior circuit layers using a screen having openings defining areas where solder mount pads are to be formed. Alternatively, a photoimageable solder mask may be coated onto the exterior surfaces and exposed and developed to yield an array of openings defining the pads. The openings are then coated with solder using processes known to the art such as wave soldering.

With respect to particle usage, it is known that a decrease in particle size may result in enhanced sintering kinetics of some particulate materials. When particle size reaches the nanometer range, full densification is often possible at substantially lower temperatures than those needed for sintering coarse-grained particulates. This is because nanoparticles imply shorter diffusion lengths while promoting boundary diffusion mechanisms. In addition to savings in energy, lower sintering temperatures also result in reduced contamination, stresses and cracking during cooling. The enhanced sintering kinetics of nanoparticulate materials are already exploited in the microelectronic packaging industry, where metal alloy nanopowders are incorporated in cold-weldable welding pastes to achieve ductile and electrically conductive metal to metal bonds.

Examples of organic products such as defined above are shown in the patents listed below, as are substrates of the non-organic (ceramic) type.

In U.S. Pat. No. 6,828,514, issued Dec. 7, 2004, there is defined a multilayered PCB including two multilayered portions, one of these able to electrically connect electronic components mounted on the PCB to assure high frequency connections there-between. The PCB further includes a conventional PCB portion to reduce costs while assuring a structure having a satisfactory overall thickness for use in the PCB field. Coupling is also possible to the internal portion from these components. This patent is assigned to the same Assignee as the instant invention.

In U.S. Pat. No. 6,815,837, issued Nov. 9, 2004, there is defined an electronic package (e.g., a chip carrier) and information handling system utilizing same wherein the package substrate includes an internally conductive layer coupled to an external pad and of a size sufficiently large enough to substantially prevent cracking, separation, etc. of the pad when the pad is subjected to a predetermined tensile pressure. This patent is also assigned to the same Assignee as the instant invention.

In U.S. Pat. No. 6,809,269, issued Oct. 26, 2004, there is defined a circuitized substrate assembly and method for making same wherein the assembly includes individual circuitized substrates bonded together. The substrates each include at least one opening, only one of which is substantially filled with a conductive paste prior to bonding. Once bonded, the paste is also partially located within the other opening to provide an effective electrical connection therewith. One example of a product using this technology is a chip carrier. This patent is also assigned to the same Assignee as the instant invention.

In U.S. Pat. No. 6,762,496, issued Jul. 13, 2004, there is described a sintered aluminum nitride substrate which has a via hole and an internal electrically conductive layer with, allegedly, high thermal conductivity and high adhesion strength between the sintered aluminum nitride substrate and the internal electrically conductive layer or the via hole. The substrate consists of an internal electrically conductive layer, at least one electrically conductive via hole formed between the internal electrically conductive layer and at least one surface of the substrate, wherein the thermal conductivity of the aluminum nitride sintering product at 25 degrees Celsius (C) is described as being 190 W/mK or more, with a corresponding adhesion strength between the aluminum nitride sintering product and the internal electrically conductive layer also mentioned.

In U.S. Pat. No. 6,743,319, issued Jun. 1, 2004, there is described an electronic circuit which is made by printing a "Parmod®" composition (commercially available from a company called Parelec, LLC, from Rocky Hill, N.J. and, per the author, described in U.S. Pat. Nos. 5,882,722 and 6,036,889) on a temporary substrate and curing it to produce a pattern of metal conductors. The conductors are laminated to a substrate under heat and pressure to produce a laminate with the metal pre-patterned into the desired circuit configuration. The conductor can also be coated with a polymer and cured to form a pre-patterned substrate. Single and double-sided circuits or multi-layers can be made this way. Per the author, the compositions include printable inks and pastes, which consist of metal flakes and/or powders mixed with a Reactive Organic Medium (ROM). The compositions are printed on the substrate and heated, as mentioned above, which decomposes the ROM, which in turn chemically welds the particulate constituents together, causing the residual organic material to leave as vapor. The result, according to this author, is a metallic deposit which can function as an electrical conductor with low resistivity and which is solderable.

In U.S. Pat. No. 6,740,287, issued May 24, 2003, there is described a method of fabricating nanostructure bodies by integrating the steps of attriting precursor nanometer-sized particulate materials, desorbing the exposed surfaces of the attrited nanoparticulates, adsorbing a surfactant on at most fifty percent of the desorbed surfaces and dispersing the surfactant-coated nanoparticulates in an organic matrix to form a homogeneous thermoplastic compound from which green bodies are shaped, dewaxed and sintered.

In U.S. Pat. No. 6,641,898, issued Nov. 4, 2003, there is described a heated and pressed printed wiring board which is made by filling "via" holes formed in layers of insulating film of the wiring board with an interlayer conducting material. The insulating film is stacked with conductor patterns, and each conductor pattern closes a hole. The interlayer conducting material forms a solid conducting material in the holes after a heating a pressing procedure. The solid conducting material includes two types of conducting materials. The first type of conducting material includes a metal, and the second type of conductive material includes an alloy formed by the metal and conductor metal of the conductor patterns. The first type of conducting material includes indium particles, tin and silver wherein tin accounts for approximately 20-80 weight percentage of the solid conductive material, and the second type of conducting material includes an alloy comprised of the solid conductive material and the conductor metal. The conductor patterns are electrically connected reliably without relying on mere mechanical contact.

In U.S. Pat. No. 6,623,663, issued Sep. 23, 2003, there is described an electro-conductive paste for use in making ceramic substrates containing from about 5 to 18 percent by weight of an organic vehicle consisting of a solvent and a binder, from about 80 to 93 percent by weight of an electro-conductive metal powder in a spherical or granular shape and with a particle diameter in the range of about 0.1 to 50 microns, and from about 2 to 10 percent by weight of a resin powder with a particle diameter in the range of about 0.1 to 50 microns which is insoluble in the solvent and has a low level of water absorption. This paste may be used for forming via hole conductors to be converted to external electrode terminals for the resulting ceramic products.

In U.S. Pat. No. 6,120,708, issued Sep. 19, 2000, there is described a conductive paste for forming via-holes in a ceramic substrate, which paste contains about 80-94 weight percentage spherical or granular conductive metal powder having a particle size of about 0.1-50 microns, 1-10 weight percentage resin powder which swells in a solvent contained in the conductive paste and has a particle size of about 0.1-40 microns, and about 5-19 weight percentage of an organic vehicle. The paste is described to hardly generate cracks during firing to thereby attain excellent reliability in electric conduction and which can provide a via-hole or through hole having excellent solderability and platability in a ceramic substrate structure.

In U.S. Pat. No. 5,891,283, issued Apr. 6, 1999, there is described a conductive paste for use in forming ceramic substrates in which the composition consists of an organic vehicle, copper powder and an organo-metallic resinate which includes, as the metal, at least one metal selected from the group consisting of Pt, Ni and Bi. The amount of the metal component in the organo-metallic resinate is in the range of about 0.1 to 5 weight percentage with respect to the total amount of the copper power and the metal component. The copper powder has preferably an average diameter in the range of about 2 to 30 microns.

In U.S. Pat. No. 4,775,439, issued Oct. 4, 1988, there is described a method of "applying a slurry of a vaporizable solvent, metal particles and a small amount of binder in the shape of the circuit pattern desired to a removable layer, vaporizing the solvent, covering the powdered metal and binder with an adhesive to hold the powdered metal and carrier in place on the removable layer, laminating the hydrocarbon containing substrate with pressure and heat to cause compacting of said powder and bonding of said compacted powder to said substrate by adhesive layer(sic), said heat being insufficient to destroy said adhesive, substrate and removable layer, and separation of the removable layer." The authors state that the adhesive is essential not only to bond the finished circuit to the final substrate but also to bond the metal particles together. They further state "A metal slurry of metal particles, e.g. noble metals such as silver, palladium, gold and platinum, is preferably mixed with the combination of other metal particles such as nickel or tin. A vaporizable solvent is mixed therewith as well as a small amount of a curable plastic binder." A particular mixture is given as an example this patent and described in column 4, lines 8-18. It is believed that such mixtures are similar to mixtures known as "Ormet" and are described in U.S. Pat. Nos. 5,538,789 and 5,565,267, among others. The mixtures are described by Ormet Corp. (formerly Toronaga Technologies) as "Transient Liquid Phase" materials because these function by heating the combination of high melting point and low melting point metal powders in a fluxing environment to the eutectic temperature at which the powders alloy and freeze again to form a continuous conductor. The mixture also includes an epoxy resin, which cures at the eutectic temperature and acts as a binder to fill the porosity between the metal particles and to adhere these to the substrate.

Complexity of the above organic products (those including organic dielectric layers, including the aforementioned PCBs and laminate chip carriers) has increased significantly over the past few years, especially as such products increase in demand over those of the ceramic variety. For example, PCBs for mainframe computers may have as many as thirty-six layers of circuitry or more, with the complete stack having a thickness of as much as about 0.250 inch (250 mils). Laminate chip carriers, in turn, may have as many as fifteen or more circuit layers as part thereof. Such organic products are known with three or five mil (a mil being one thousandth of an inch) wide signal lines and twelve mil diameter thru-holes, but for increased circuit densification in many of today's products, the industry is attempting to reduce signal lines to a width of two mils or less and thru-hole diameters to two mils or less. Such high densification understandably necessitates the most efficient means of interconnecting the respective layers in the smallest space available and using the best materials possible. As defined herein, the present invention is able to accomplish this.

As defined herein, the present invention utilizes a new and unique type of conductive paste to provide interconnections within circuitized substrates. As will be defined, this paste is adapted for providing interconnections between conductive pads or the like conductors (including the end segments of thru-holes) on separate organic dielectric layers of the substrate, as well as within openings (included plated thru-holes or openings intended for plated thru-holes but wherein the plating has not been provided) provided with the dielectric layer(s) to couple selected conductors of the conductive layers within the substrate. More particularly, one embodiment of the conductive pastes as taught herein includes what are referred to herein as metal "nano-particles" (particle size range defined below). Other embodiments include such "nano-particles" in combination with solder particles (of "nano-particle" and/or "micro-particle" (size range defined below also) size), solder "micro-particles" including with conducting polymer material (defined below) and also with an organic (defined below), metal "micro-particles", including with such conducting polymer and possibly organic, and simply with conducting polymer and possibly organic. Use of these compositions as the conductive pastes allow the sintering and/or melting of the compositions during lamination of the substrate layers, a highly desirable feature since such lamination is required to bond the layers together, thereby avoiding additional processing and equipment. Accordingly, successfully formed circuit paths are formed in the pastes without harming the dielectric layers which form part of the substrates because the sintering and/or melting points of the paste composition are lower than those of the dielectric layers. It is believed that a circuitized substrate having organic dielectric material and an excellent conductive paste as defined herein for interconnecting electrical conductors as part thereof would constitute a significant advancement in the art. It is further believed that a method of making same, as well as an electrical assembly adapted for using same would constitute significant art advancements.

OBJECTS AND SUMMARY OF THE INVENTION

It is, therefore, a primary object of the invention to enhance the circuitized substrate art.

It is another object of the invention to provide a circuitized substrate having a new and unique conductive medium in the form of a conductive paste to thus assure an enhanced electrical connection between electrical elements which come in physical contact with the paste.

It is another object of the invention to provide a multilayered circuitized substrate assembly including two or more substrates bonded together to form a larger structure which can be used, e.g., as a PCB or chip carrier.

It is yet another object of the invention to provide an electrical assembly adapted for utilizing the circuitized substrate defined herein as part thereof.

According to one aspect of the invention, there is provided a circuitized substrate comprising first and second spaced-apart electrically conductive layers, at least one organic dielectric layer including first and second opposing surfaces, the at least one organic dielectric layer positioned substantially between the spaced-apart electrically conductive layers, at least one opening within the organic dielectric layer and extending from the first conductive layer to the second conductive layer, and a quantity of conductive paste positioned within the opening, this quantity of conductive paste including at least one metallic component including a plurality of nano-particles and electrically coupling the spaced-apart electrically conductive layers.

According to another aspect of the invention, there is provided a method of making a circuitized substrate comprising providing a first electrically conductive layer, providing at least one organic dielectric layer including first and second opposing surfaces, providing a second electrically conductive layer and positioning this second layer such that the organic dielectric layer is located substantially between the conductive layers, forming at least one opening within the dielectric layer and extending from the first electrically conductive layer to the second electrically conductive layer, and positioning a quantity of conductive paste within the opening, this quantity of conductive paste including at least one metallic component including a plurality of nano-particles and serving to electrically couple the first and second electrically conductive layers.

BEST MODE FOR CARRYING OUT THE INVENTION

Figure 1:
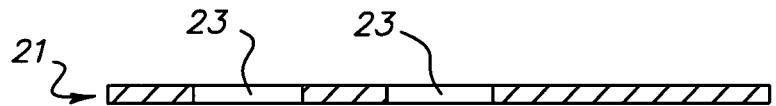
FIGS. 1-4 are side elevational views, in section, showing the steps of making a circuitized substrate according to one embodiment of the invention.

For a better understanding of the present invention, together with other and further objects, advantages and capabilities thereof, reference is made to the following disclosure and appended claims in connection with the above-described drawings. Like figure numbers will be used from FIG. to FIG. to identify like elements in these drawings.

By the term "circuitized substrate" as used herein in one embodiment is meant to include a substrate having at least one (and preferably more) dielectric layer(s), at least two (and preferably more) electrically conductive layers, and at least one (and preferably more) openings extending through the dielectric layer and interconnecting the two conductive layers. The electrically conductive layers may each include one or more conductors (e.g., signal lines and/or pads). Significantly, the dielectric material which constitutes the at least one dielectric layer must possess a melting point greater than that of the conductive pastes defined herein. Examples of such dielectric materials include: fiberglass-reinforced epoxy resin ("FR-4"), polytetrafluoroethylene (Teflon), polyimide, polyamide, cyanate resin, photo-imageable material, and other like materials. Some of these dielectric materials may also be defined as of the "high temperature" kind, meaning that such a layer can withstand temperatures greater than about 350 degrees C. for a time period long enough to enable successful lamination of the layer with other layers/substrates, usually a period of about two hours, without the dielectric material breaking down into low molecular weight fragments. One example of such material known today is sold under the product name "RO2800" dielectric material by Rogers Corporation, Rogers, Conn. "RO2800" is a trademark of Rogers Corporation. The material for the conductive layers, which may be power, signal and/or ground layers, may be copper or copper alloy, but may further include or be comprised of additional metals such as nickel, aluminum, gold, etc. or alloys thereof.

By the term "conducting polymer" as used herein to define one of the elements of the solder paste compositions taught herein is meant a polymer material which is electrically conductive by itself, without the addition of other electrically conductive materials. Examples of such materials are described below.

By the term "conductive paste" as used herein is meant an electrically conductive paste composition adapted for use in openings of substrates as well as between conductors which form parts of conductive planes of such a substrate. Examples of such conductive pastes are defined below.

By the term "electrical assembly" is meant at least one circuitized substrate as defined herein in combination with at least one electrical component (defined below) electrically coupled thereto and forming part of the assembly. Examples of known such assemblies include chip carriers which include one or more semiconductor chips as the electrical components, the chips usually positioned on the substrate and coupled to wiring (e.g., pads) on the substrate's outer surface or to internal conductors using one or more thru-holes. Another example is a printed circuit board.

By the term "electrical component" as used herein is meant components such as semiconductor chips and the like which are adapted for being positioned on the external conductive surfaces of circuitized substrates and electrically coupled to the substrate for passing signals from the component into the substrate whereupon such signals may be passed on to other components, including those mounted also on the substrate, as well as other components such as those of a larger electrical system which the substrate forms part of. This term is broad enough to encompass a chip carrier, because a chip carrier is also adapted for being positioned on and electrically coupled to a printed circuit board.

By the term "information handling system" as used herein shall mean any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as servers, mainframes, etc.

By the term "micro-particles" as used herein to define various particles within the compositions of this invention is meant particles having an average size of from about one micron (1,000 nanometers) to about fifty microns (50,000 nanometers).

By the term "nano-particles" as used herein to define various particles within the compositions of this invention is meant particles with an average size of from less than about 0.01 micron (ten nanometers) to about one micron (1,000 nanometers).

By the term "organic" as used herein to define one of the elements of the paste compositions defined herein is meant either a polymer or monomer material, a preferred example being epoxy resin of the same type used in present PCB dielectric layers.

By the term "sintering" as used herein is meant to define a process of fusing or welding or growth of adjacent surfaces of particles in a powder by heating the powder to a temperature below the melting-point of the particles.

The term "thru-hole" is defined in the above Background.

FIGS. 1-4 illustrate the steps of making a circuitized substrate according to one aspect of the invention. In FIG. 1, a conductive layer 21, preferably a copper sheet, is etched (e.g., using an etching solution including cupric chloride) to define a plurality of openings 23 therein. Although only two openings are depicted in FIG. 1, this is meant to be representative only. In one example, a total of 2500 openings may be provided within a rectangular layer having dimensions of about 52.5 millimeters (mm) wide by about 52.5 mm long, and a thickness of about 0.0356 mm. Openings 23, in the embodiment shown here, are meant to form "clearance" openings in the finished substrate, such that conductive openings ("thru-holes", as defined above) may be formed within the substrate and extend through the substrate without electrically contacting the conductive layer 21. "Clearance" openings are known in the PCB art and further definition is not deemed necessary. Layer 21 is preferred in the invention to provide an interim conductive layer which may be used as power or ground for some of the circuitry of the circuitized substrate of this invention. As will be defined below, at least one thru-hole to be used in the substrate will be electrically connected to layer 21, for this purpose.

Figure 2:
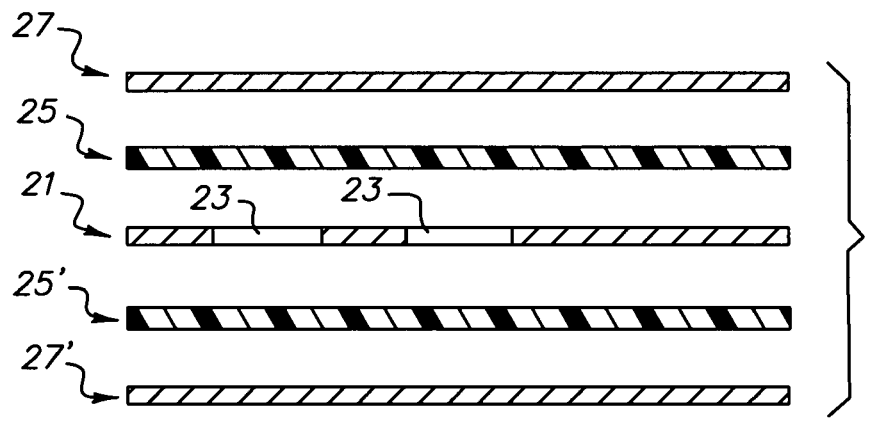

In FIG. 2, layer 21 is shown aligned with opposing dielectric layers 25 and 25', in addition to opposing conductive layers 27 and 27', these latter two conductive layers being oriented adjacent the outside surfaces of the respective dielectric layers 25 and 25', respectively. Layers 27 and 27' are also preferably copper and may possess the same dimensions as layer 21, although the thickness of said layers may be different than that of layer 21, with one example of such thickness being about 0.012 mm. In this embodiment (and also in other embodiments defined herein), each of the dielectric layers 25 and 25' is selected such that its melting temperature will be sufficiently high enough so as to allow sintering and, possibly, melting of the conductive paste (defined below) with the openings in these dielectric layers without melting the dielectric material itself. This represents an important aspect of the invention for reasons understood by the description below and elsewhere herein. In one embodiment, the dielectric material may be referred to as a high temperature dielectric layer, meaning that it can withstand temperatures greater than about 350 degrees C. for a time period long enough to enable successful lamination of the layers with other elements which are to form the substrate, or, in one embodiment, a multilayered substrate assembly comprised of two or more substrates laminated together. A preferred example of such material known today is the aforementioned "RO2800" dielectric material sold by Rogers Corporation. "RO2800" is a polytetrafluoroethylene (PTFE) composite material having a low dielectric constant and includes fused silica as one of the composition elements. It is rated with 0% water solubility and has a specific gravity of 2.1. Each layer 25 and 25' includes an initial thickness of about 0.05 mm. The aligned subassembly of FIG. 2 is now laminated together to form a "sandwich", as now seen in FIG. 3. Conventional lamination processing and equipment may be used. In one example, the five layers shown in FIG. 2 may be laminated at a temperature of about 365 degrees C. using a pressure of about 2000 pounds per square inch (PSI) for a time period of about 125 minutes.

Figure 3:
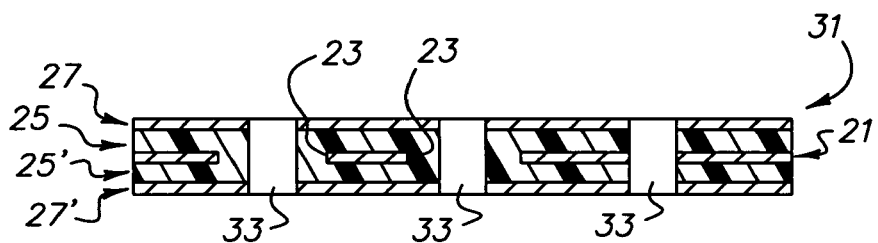

Although the use of two dielectric layers and three conductive layers has been described, it is understood that in the broadest aspects of this invention, only one dielectric layer and two conductive layers are required, with the thru-hole connections to be formed herein (using the conductive pastes taught herein) designed to interconnect the two conductive layers through the interim dielectric layer. As also seen in FIG. 3, the laminating of the multiple layers of FIG. 2 in effect results in substantially single, combined dielectric layer due to the "blending" of both layers 25 and 25' during the lamination. As stated, the use of the interim conductive layer 21 adds more capability to the final substrate. The structure as shown in FIG. 3 may also be referred to as a "core" substrate, meaning that it may be aligned with and bonded to other substrates to form a multilayered substrate such as a PCB.

The resulting laminated structure 31 is shown in FIG. 3. When compressed from the layers in FIG. 2 having the above initial thickness dimensions, the laminated structure 31 will possess a total thickness of about 0.160 mm. After lamination, a plurality of openings 33 are formed within structure 31, preferably using laser or mechanical drilling. In one example, a total of 5600 openings may be provided, each preferably having a diameter of about 0.050 mm. As mentioned above, the dielectric material of layers 25 and 25' has "blended" and thereby extended within the clearance openings 23 as a result of the lamination step, such that this combined (in this area) material now forms the side walls of the portion of the openings 33 located within layer 21. Further, it is noted that openings 23 have the conductive material of layers 27 and 27' for the walls in the outer portions of the laminated structure. FIG.

3 also shows that an opening 33 is formed within the structure at a location distant from the openings 23 such that the opening (to the right in FIG. 3) will physically contact middle conductive layer 21, as also mentioned above. Thus, this particular opening 33 will include side walls of conductive material at layer 21, unlike the other two openings to the left in FIG. 3. As explained below, this represents an alternative means of providing electrical coupling of selected elements of the invention.

Figure 4:
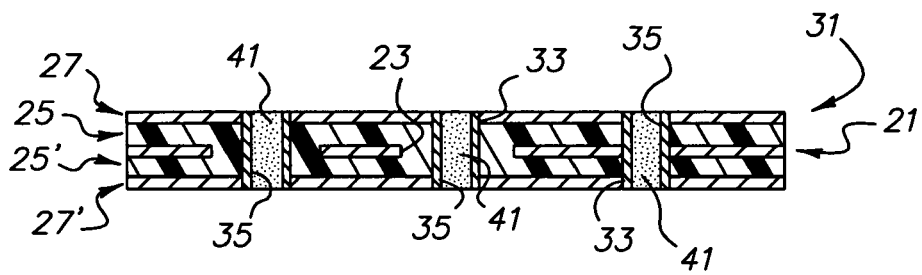

In FIG. 4, each of the openings 33 is plated, preferably with copper, to form inner conductive layers 35. Importantly, this is an optional step in making the substrate of the invention because it is possible to omit it and still provide conductive thru-holes here (by using the conductive paste defined below). The thin added plating is desired in some occasions to provide an even more enhanced connection. A preferred method of accomplishing the plating is to use a "flash" plating of electro-less copper. This plating process is typically comprised of four operations: cleaning; activation; acceleration; and deposition. During the cleaning phase, organic contaminants are removed from exposed metal surfaces. Activation includes a dip in a catalyst bath typically including hydrochloric acid and possibly tin or sodium chloride, and activation in a bath of hydrochloric acid, tin chloride and palladium chloride. The tin (Sn+2) ion reduces the palladium (Pd+2) to palladium, which is deposited on the substrate. Remaining Sn+2 and Sn+4 are selectively removed by an accelerator such as fluoboric or sulfuric acid with hydrazine. Key elements of the electro-less copper chemistry include sodium hydroxide, formaldehyde, EDTA (or other chelater) and a copper salt. During the complex reaction with the palladium as a catalyst, the formaldehyde reduces the copper ions to metallic copper. Each layer 35 has a thickness of only about 0.001 mm. It is seen in FIG. 4 that the plated opening to the right is electrically coupled to inner layer 21 because the plating is deposited on the exposed areas of layer 21. The plating of the other two openings to the left in FIG. 4 is in contact with the defined dielectric material of layers 25 and 25' in addition to the outer conductive layers 27 and 27'. The right opening 33 is also in contact with the outer conductive layers 27 and 27'. It is again to be understood that forming plated layers 35 is an optional step in forming a substrate as defined herein, but may be preferred in some circuit designs to further assure sound conductive paths in these portions of the structure.

The next step, as also shown in FIG. 4, involves the deposition of conductive paste 41 within each of the plated openings. Such deposition may be accomplished using conventional paste printing processes or dispensing through convention needles. Significantly, the conductive paste as used in this embodiment includes a metal component including nano-particles. Metals which may form the nano-particles include copper, silver, gold, silver-coated copper, gold-coated copper, and alloys thereof. In one embodiment of the invention, a conductive paste having silver nano-particles may be used. Depending on the desired sintering (and, possibly, melting) temperature(s) desired to sinter (and, possibly, melt) the conductive paste and thereby form sound conductive paths through the paste, the conductive paste composition used herein may further include additional elements. Such elements may include micro-particles of metal (including silver), micro-particles of solder, and, in some situations, the addition of a conducting polymer and, even further, the addition of an organic. Several examples of the various compositions which may be used successfully herein are provided below. An important aspect of this invention, as understood, is that the conductive paste, once positioned with the respective opening, will be capable of undergoing a sintering phase in which selected ones of the nano-particles will sinter, thereby forming several contiguous circuit paths through the composition. In addition to sintering, the composition may also include elements (e.g., micro-particles of solder or a metal) which will melt to thereby form still further contiguous paths for circuit flow. Importantly, if these added elements are used, the melting is not to occur until at least sintering has begun and, possibly, after sintering has been achieved. The result of this of course is the formation of both circuit paths formed by sintering and melting, thereby assuring an excellently conducting thru-hole due to the presence of the conductive paste therein.

Suitable additional metal, including solder, elements for use in the compositions taught herein may be referred to as low melting point (LMP) metallurgies, and are mixed with the primary metal (e.g., silver or a silver-copper mixture) nano-particles. These include tin-lead, bismuth-tin, bismuth-tin-iron, tin, tin-silver, tin-gold, tin-silver-zinc, tin-silver-zinc-copper, tin-bismuth-silver, tin-copper, tin-copper-silver, tin-indium-silver, tin-antimony, tin-zinc, tin-zinc-indium, copper-based solders, and alloys thereof. These secondary LMP metallurgies include melting points greater than that of the primary metal and thereby melt, once the primary metal has effectively sintered, or these LMP metallurgies may begin melting during the sintering, depending on how close the melting point of same is relative to the corresponding melting point of the primary metal. A further understanding of this relationship is possible from the Examples and Table provided below.

As further seen in the appended Examples and Table, some compositions taught herein may include a conducting polymer as part thereof. Acceptable conducting polymers include doped (or derivatives of) polyaniline, polypyrrole, polythiophene, and inherently conducting polymer. Such polymers are known in the art and further description is not considered needed.

Still further, the compositions herein may include what is defined as an organic. As mentioned, one example of such an organic is epoxy resin. Others are possible.

Finally, selected ones of the compositions are made using a solvent in order to form a slurry or "ink" of the composition and thus render is more suitable for needle dispensing or other form of precise deposition such as screen/stencil or ink jet printing. One specific example of a solvent usable herein is propylene glycol methyl ether acetate. Generally speaking, it was determined that when a conducting polymer was used, it some instances it was desirable to also use a solvent when the total organic content was less than about ten percent by weight of the composition.

The following Table represents some examples of paste compositions which include the primary nano-particle metal silver combined in some examples with silver micro-particles and the resulting sintering temperature of same. To these particular compositions is added a suitable LMP metal which possesses a melting point greater than or even substantially the same as that of the corresponding primary metal(s). SAC is meant to be tin-silver-copper (Sn—Ag—Cu), and in one more specific example, 96.5 percent by weight tin, 3 percent by weight silver and 0.5 percent by weight copper. Percentages shown are by weight, the silver being prior to addition of the LMP metallurgies.

TABLE

| Silver Composition (particle size, nanometers) | Sintering Temperature (degrees Celsius) | Suitable LMP Metallurgy (melting Point, degrees Celsius - particle size, nanometers) |
|---|---|---|
| Silver (5-10) | 130 | Tin-lead (183 - 10,000), tin (232 - 5,000), SAC (220 - 25,000) |
| Silver (5000) - 80% + Silver (15) - 20% | 200 | tin (232 - 5,000), SAC (220 - 25,000). |
| Silver (5000) - 80% + Silver (15) - 10% + Silver (70) - 10% | 220 | tin (232 - 5,000), SAC (220 - 25,000). |
| Silver (5000) - 80% + Silver (70) | 235-240 | tin (232 - 5,000) |
| Silver (5000) | 350 | |

It is seen from this Table that the melting points of the LMP metallurgies is carefully selected so as to be greater than the corresponding sintering temperature of the silver (including the combined silvers), or, in some instances, substantially the same such that sintering of the silver will occur prior to or during melting of the LMP metallurgies. It is preferred that melting occurs after sintering to avoid possible sintering difficulties due to melt interference with the sintering process.

It is also seen from this Table that sintering temperatures decrease with decreasing particle size. Further, the addition of nano-particles into powders including micro-particles also reduces overall sintering temperatures. The method defined in Example 3 below represents a new approach to combining both nano-particle and micro-particles.

The above compositions and the Examples below are examples only and not intended to limit the scope of this invention. The following Examples also represent various combinations of conductive paste compositions, in addition to the processes used to prepare such paste compositions, according to various aspects of the invention.

Example 1

Fifty grams (gm) of cycloaliphatic epoxy resin (e.g., one sold under product designation "ERL-4211" by the Union Carbide Corporation, Danbury, Conn.) was mixed with about fifty gm of hexahydro-4-methylphthalic anhydride and 0.4 gm N, N dimethyl benzylamine. The mixed solution was stirred for ten minutes to assure uniform mixing. One gm of silver nano particles with average particle size fifteen nm and four gm of silver micro-particles with average particle size five microns was thoroughly mixed. Five gm of this mixed silver was added to one gm of the cycloaliphatic epoxy mixed solution and formed into a printable paste and a layer of this paste material was printed onto a copper substrate. This layer was then cured at approximately 200 degrees C. for about two hours and 240 degrees C. for about one hour. The resistance of the cured paste (3 inch long and 0.003 square inch cross section area) measured about seven milliohms (mΩ). Resistance of the paste after curing at 200 degrees C. for about two hours measured about 24 milliohms (mΩ). A layer of this paste was also deposited on Cu foil and laminated at 200 degrees C. for 2 hrs. The mechanical strength of this laminate was about 2000 p.s.i. Resistance of four gm of this paste was added to another micro (average particle size 5 microns) filled silver epoxy system where the epoxy includes about 5% conducting polymer and formed into a printable paste. A layer of this paste material was printed onto a copper substrate. This layer was then cured at approximately 200 degrees C. for about two hours and 240 degrees C. for about one hour. The resistance of the cured paste (three inch long and 0.003 square inch cross section area) measured about 27 milliohms (mΩ). Resistance of the paste after curing at 200 degrees C. for about two hours measured about thirty-two milliohms (mΩ). A layer of this paste was also deposited on Cu foil and laminated at 200° C. for two hrs. The mechanical strength of this laminate was about 3000 p.s.i.

Example 2

Fifty grams (gm) of "ERL-4211" epoxy resin was mixed with about fifty gm of hexahydro-4-methylphthalic anhydride and 0.4 gm N, N dimethyl benzylamine. The mixed solution was stirred for ten minutes to assure uniform mixing. Twenty gm of silver micro particles with average particle size five microns and five gm of silver nano particle having a D90 particle size of 0.07 micron (D90 meaning 90% of the particles have a diameter less than or equal to 0.07 micron) was thoroughly mixed. 25 gm of this mixed silver was added to four gm of the mixed cycloaliphatic epoxy mixed solution and formed into a printable paste. A layer of this paste material was printed onto a copper substrate. This layer was then cured at approximately 200 degrees C. for about two hours and 240 degrees C. for about one hour. The resistance of the cured paste (three inch long and 0.003 square inch cross section area) measured about eighteen milliohms (mΩ). Resistance of the paste after curing at 200 degrees C. for about three hours measured about 34 milliohms (mΩ). A layer of this paste was also deposited on Cu foil and laminated at 200 degrees C. for two hrs. The mechanical strength of this laminate was about 1900 p.s.i. Four gm of this paste was added to a micro-particle (average particle size five microns) filled silver epoxy system where the epoxy contained 5% conducting polymer and formed into a printable paste. A layer of this paste material was printed onto a copper substrate. This layer was then cured at approximately 200 degrees C. for about two hours and 240 degrees C. for about one hour. The resistance of the cured resistors (three inch long and 0.003 square inch cross section area) measured about 30 milliohms (mΩ). Resistance of the paste after curing at 200 degrees C. for about three hours measured about 40 milliohms (mΩ). A layer of this paste was also deposited on Cu foil and laminated at 200 degrees C. for 2 hrs. The mechanical strength of this laminate was about 2800 p.s.i.

Example 3

Fifty gm of micro-particle silver were mixed with fifty gm silver nitrate solution and fifty gm soap solution and sonicated for sixty minutes. Fifty ml formaldehyde solution was added to the mixed silver solution and sonicated for additional ninety minutes and stirred for thirty minutes. The soap solution was used to reduce surface tension of the solution. Low surface tension solution will have better micro-particle silver dispersion. The silver nitrate was reduced to nano-particle sized silver colloids at room temperature by formaldehyde. Nano-particle sized silver with an average particle size of 50 nm was subsequently deposited uniformly at the surface of silver micro-particles. After completion of the chemical reduction, the suspension was washed with ethyl alcohol, which precipitated out the silver colloids. This washing step was repeated twice more to finally recover relatively pure silver nano-particle and micro-particle silver mixtures where silver nano-particles were uniformly distributed throughout the mixture. This mixed silver composition was air dried and heated at 125 degrees C. for one hour to remove residual organics from the mixture. The method defined in this Example 3 for incorporating nano-particles into a micro-particle composition represents a new method of doing so. As stated, this method involves the direct and uniform deposition of such nano-particles from solution onto the surfaces of the micro-particles (here, silver).

Example 4

Fifty gm of "ERL-4211" cycloaliphatic epoxy resin was mixed with about fifty gm of hexahydro-4-methylphthalic anhydride and 0.4 gm N, N dimethyl benzylamine. The mixed solution was stirred for ten minutes to assure uniform mixing. Ten gm of a silver nano-particle and micro-particle mixture (prepared in Example 3) and 0.5 gm of tin-silver-copper micro-particle (with average particle size ten microns) was added to two gm of the cycloaliphatic epoxy mixed solution and formed into a printable paste. A layer of this paste material was printed onto a copper substrate. This layer was then cured at approximately 200 degrees C. for about two hours and 265 degrees C. for about one hour. The resistance of the cured resistors (three inch long and 0.003 square inch cross section area) measured about ten milliohms (mΩ).

Example 5

Fifty gm of "ERL-4211" cycloaliphatic epoxy resin was mixed with about fifty gm of hexahydro-4-methylphthalic anhydride and 0.4 gm N, N dimethyl benzylamine. The mixed solution was stirred for ten minutes to assure uniform mixing. Ten gm of a silver nano-particle and micro-particle mixture (prepared in Example 3) was added to two gm of the cycloaliphatic epoxy mixed solution and formed into a printable paste. A layer of this paste material was printed onto a copper substrate. This layer was then cured at approximately 200 degrees C. for about two hours and 265 degrees C. for about one hour. The resistance of the cured resistors (three inch long and 0.003 square inch cross section area) measured about 6.5 milliohms (mΩ).

Example 6

Eight gm SAC (Sn 95.5% by weight, Ag 3.9% by weight and Cu 0.6% by weight) paste was mixed with two gm silver nano-particles (average particle size 15 nm), four gm silver nano-particle (D90 particle size of 0.07 micron) and six gm micro-particle silver (average particle size five microns) was thoroughly mixed in methyl ethyl ketone (MEK) solvent. The sample was then air dried and one gm of PGMEA (propylene glycol methyl ether acetate) added to make a paste. A layer of this paste material was deposited onto a copper substrate. This layer was then cured at approximately 200 degrees C. for about two hours and 240 degrees C. for about one hour. The resistance of the cured paste measured about eight milliohms (mΩ). Four gm of this SAC-silver paste was mixed with 16.6 gm silver paste containing 90% by weight silver, 6% by weight epoxy and four % by weight PGMEA. This mixture contains 5% by weight conducting polymer. A layer of this paste material was deposited onto a copper substrate. This layer was then cured at approximately 200 degrees C. for about two hours. The resistance of the cured paste measured about 28 milliohms (mΩ). Another layer of this paste material was deposited onto a copper substrate. This layer was then cured at approximately 200 degrees C. for about two hours and 240 degrees C. for about one hour. The resistance of the cured paste measured about nine milliohms (mΩ).

Example 7

A six mill thick dielectric with a twelve micron external copper layer was laser drilled to make fifty micron diameter holes, which were then filled with LMP-based conducting paste including ninety % by weight conducting filler (forty % by weight copper, forty % by weight tin and twenty % by weight tin-lead) eight % by weight epoxy and two % by weight PGMEA. This composition was then cured at 190 degrees C. for forty minutes. The dielectric with the cured paste was then dipped into a tin-lead electrolytic solution in an electroplating bath and stirred vigorously at 26 degrees C. A tin-lead rod was used as the anode and the dielectric with the cured paste was used as the cathode materials for the electroplating process. Around thirty amps per square foot of current were applied for tin-lead solder electroplating/coating of the copper surface. A thin layer of solder was deposited on the copper surface. The solder and copper coated cured conductive adhesive line was removed from the electrolytic solution and washed with water and air dried at room temperature.

Example 8

A six mill thick dielectric with a twelve micron external copper layer was laser drilled to make fifty micron diameter holes, which were then filled with silver conducting paste containing eighty-eight % by weight silver micro-particles (average particle size being five microns) and twelve % by weight cycloaliphatic epoxy and then partially cured at 180 degrees C. for forty minutes. A thin layer of photo-resist was then applied, exposed, developed to expose the paste-filler holes. Dielectric with partially cured paste was then dipped into an immersion tin solution at sixty-five degrees C. The tin selectively coated only the exposed copper surface in the paste. A thin layer of tin was deposited on the copper surface. This tin-coated adhesive-filled substrate was then removed from the immersion tin solution and washed with water and air dried at room temperature. The photo-resist was stripped and the exposed, external copper was etched with ammoniacal solution.

As understood, the function of the melted metallurgies (e.g., the solder micro-particles) is to provide an enhanced electrical connection through the paste in the final substrate structure. Significantly, the primary nano-particle metals as defined above will sinter and, if the additional LMP metallurgies are added, including possibly the additional conductive polymer (and, if desired, organic) these added LMP metallurgies will also melt during subsequent lamination procedures such as when the structure of FIG. 4 (or that of FIG. 5) is bonded to other dielectric and conductive layers, e.g., to form a larger, multilayered substrate such as a large PCB). The heat generated during such lamination is well known, and is necessary to adequately bond (laminate) the various layers together into such a thicker circuitized substrate. The elements of the paste composition will thus sinter and possibly melt form a series of interconnecting paths through the paste, thereby enhancing the connection formed. The dielectric layers of the structure are also not harmed because these layers have melting points greater than the sintering and melting temperatures and are able to withstand the lamination temperatures.

It is also possible to deposit immersion tin, tin-lead, or a tin-gold coating on the outer, exposed surfaces of conductive paste 41 when the paste includes copper as its base component. The presence of such a coating (layer) aids in preventing copper etching which may occur during removal of outer conductive layers 27 and 27', thereby assuring the copper will maintain its desired conductivity as a result of the lamination.

Figure 5:
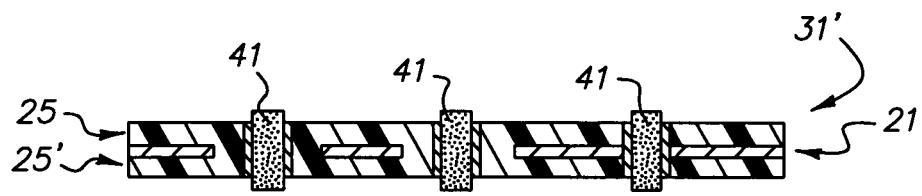
FIG. 5 illustrates an optional step which may be performed on the substrate of FIG. 4 to better enable it to perform as an interim substrate such as may be used in the assembly shown in FIG. 6 below.

FIG. 5 represents an alternative structure 31' which may be formed from the substrate 31 of FIG. 4. As mentioned, substrate 31' may serve more effectively as an interconnecting substrate in which the conductive pastes will engage conductors on other substrates and thereby form a series of conducting paths from the coupled substrates. One example of such a formation is presented below in FIG. 6. This interim substrate 31' is thus able to provide a plurality of electrical connections through the paste using the sintered and possibly melt-formed electrical paths. Substrate 31' is similar to substrate 31 of FIG. 4 except that the outer conductive layers 27 and 27' (and the portions of the plated internal layers 35 on said layers 27 and 27') are removed. Such removal, preferably by etching, leaves portions of the conductive paste protruding externally of the substrate main body portion and thus more adaptable for engaging conductors of other substrates such as shown (and explained below) in FIG. 6. It should also be understood that the substrate 31 of FIG. 4 may serve as such an interconnecting structure, e.g., by providing interim sheets of dielectric (one example being known "pre-preg" dielectric) between substrate 31 and the other substrates, with openings formed therein to accommodate paste within the substrate's holes 41. When the substrates are laminated, this paste will move through the interim dielectric layers and into corresponding openings of the other substrate or against conductors or pads on the facing surfaces. Either way, effective connections are completed, using the paste as the interconnecting medium.

Figure 6:
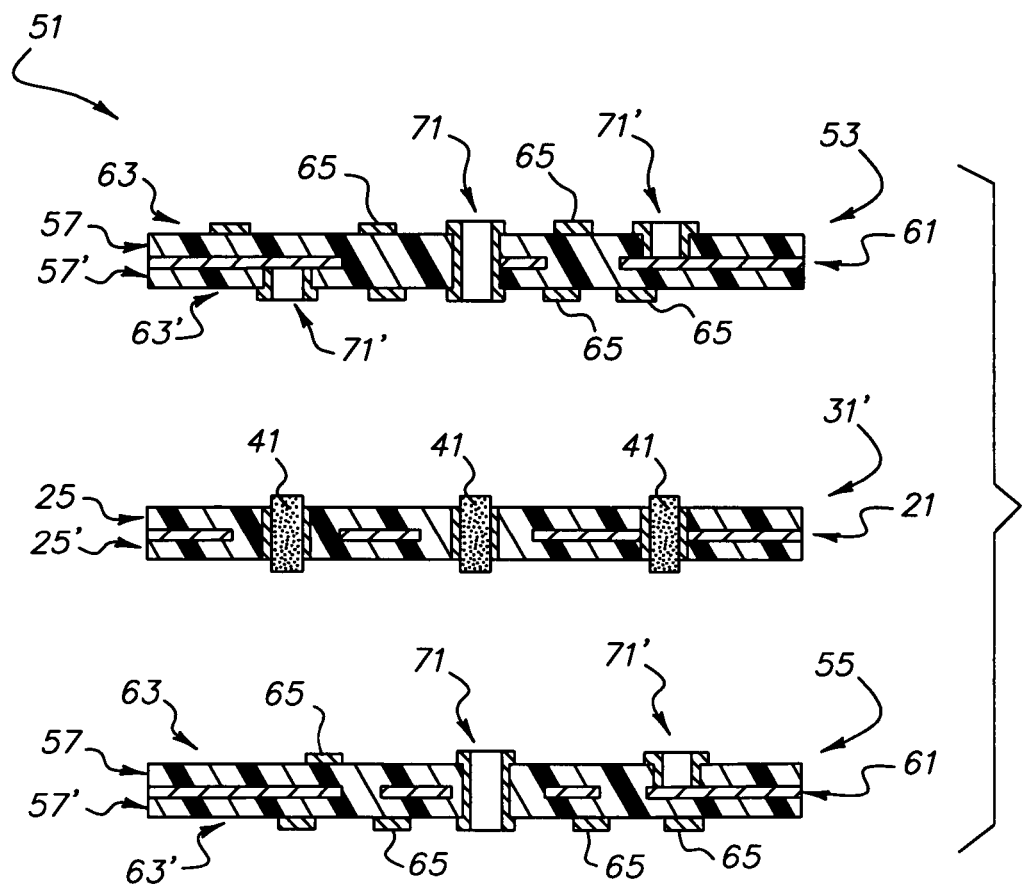
FIG. 6 is an exploded, side elevational view, in section, showing the various parts of a multilayered circuitized substrate assembly according to one embodiment of the invention.

FIG. 6 represents one example of a multilayered circuitized substrate assembly 51 according to one embodiment of the invention. Assembly 51 utilizes the circuitized substrate 31' of FIG. 5 as an interconnector to electrically couple two opposing substrates 53 and 55. Each substrate 53 and 55 may include at least one dielectric layer 57 (preferably two, including a second layer 57') with at least one conductive layer 61 (preferably two additional outer conductive layers 63 and 63' for each, one or both of these added layers being in the form of a signal layer having a plurality of electrical conductors 65 (in FIG. 6, these are preferably signal lines or pads) as part thereof. The dielectric material for each of the dielectric layers of the substrates 53 and 55 is preferably a high temperature dielectric and preferably the same material as that used for layers 25 and 25' of the interconnecting substrate 31' defined above. Substrates 53 and 55 may also include a plurality of thru-holes, including in the form of a PTH 71 or a "blind" via 71', for being electrically coupled to designated conductive elements of the substrates. The three substrates shown in FIG. 6 are aligned to assure subsequent electrical connection between corresponding conductive elements (especially between the projecting paste 41 segments and corresponding, facing conductive elements of the opposing substrates). For example, the paste 41 to the right of substrate 31 is shown to align with the corresponding lower conductor 65 on the undersurface of upper substrate 53, while the lower projecting segment of this same paste is aligned to connect to the upper conductive portion of a "blind" via (thru-hole) 71' located on the upper surface of the lower substrate 55. Such an upper conductive portion also understandably represents an electrical "conductor" such as the conductors 65 because it is capable of being engaged by paste and thus electrically coupled thereto. A sound electrical path is thus formed between the lower right pad 65 on upper substrate 53 and the inner conductive layer 61 of lower substrate 55 when the three substrates of FIG. 6 are laminated together. Several other electrical paths are readily discernible from the structure formed using these three substrates and further description is not considered necessary.

The above lamination, using conventional lamination equipment, may be accomplished at temperatures and pressures known in the art, and, as stated, serves to sinter (and melt, if appropriate) the paste compositions in the manner defined. In one embodiment, lamination may be accomplished at a pressure within the range of from about 1700 PSI to about 2300 PSI for a total time period of about three hours. During this time period, the lamination temperature is raised from an initial ambient temperature of about 21 degrees C. to about 364 degrees C. in about 45 minutes and held at this elevated temperature for a period of about 125 minutes. The temperature is then decreased to about 260 degrees C. over a time period of about 100 minutes and then to a temperature of about 177 degrees C. over a period of the remaining minutes in the total time period defined above, after which it is dropped to the initial ambient temperature. This lamination procedure is deemed successful when laminating the substrates having the dielectric material and conductive paste defined above. Other temperatures, times and pressures will likely be required for alternative materials.

The three substrate embodiment shown in FIG. 6 is representative only and not intended to limit the invention. It is within the scope of this invention to combine several additional substrates, including utilizing two or more interconnecting substrates as shown in FIG. 5 in combination with four or more substrates of the type represented by substrates 53 and 55, to form other multilayered assemblies having many additional conductive layers and thus operational capabilities. These additional substrates may be, understandably, also formed using the unique methodology taught herein. For example, substrate 53 may be formed by laminating two high temperature dielectric layers onto the interim conductive layer 61 (following clearance opening formation, if desired) and the thru-holes 71 and 71' then formed to the desired depths as shown. The outer circuit layers can be formed using conventional photolithographic processing known in the PCB art in which an outer copper layer is covered with a suitable photo-resist, the resist is developed to expose a pattern, and the structure is then etched to remove undesired (exposed) copper to produce the desired pattern. As stated, such processing is known and further explanation is not considered necessary. As explained above, the conductive paste may function as a conductive medium within a plated or non-plated opening with a designated dielectric layer (or layers). In addition, the paste may be used to simply couple electrical conductors on matching pairs of substrates. Such conductors may be formed using conventional photolithography processing, as mentioned, and serve as signal lines or pads for the layer-conductor "sub-composite." These "sub-composites" are aligned with the respective conductors on a corresponding facing (e.g., first) surface thereof also facing one another. Conductive paste of the type defined herein is positioned between the facing conductors (e.g., using a needle dispenser or printing operation) by preferably applying it to one "sub-composite" (on the conductor(s) thereof). The sub-composites are then laminated using conventional equipment and a circuitized substrate is formed, this substrate thus including, at a minimum, the two conductors (preferably two conductive planes each including a plurality of such conductors) electrically coupled using the conductive paste taught herein. This structure will also include, as a minimum, the two dielectric layers which support the conductive planes, respectively, albeit the two "blend" essentially into one from the heat and pressure of the lamination. Other conductive and dielectric layers may also be added to form a thicker, multilayered structure.

To produce an electrical assembly of the type defined above, a circuitized substrate as formed using the teachings herein is then coupled to one or more electrical components (e.g., a semiconductor chip). In one embodiment, such coupling may be accomplished using solder ball connectors and convention "C-4" solder attach technology. "C-4" stands for "controlled collapse chip connection" in which solder balls connect contact sites on the chip underside to conductors on the upper surface of the circuitized substrate. This form of connection is well known in the art and further explained below.

Figure 7:
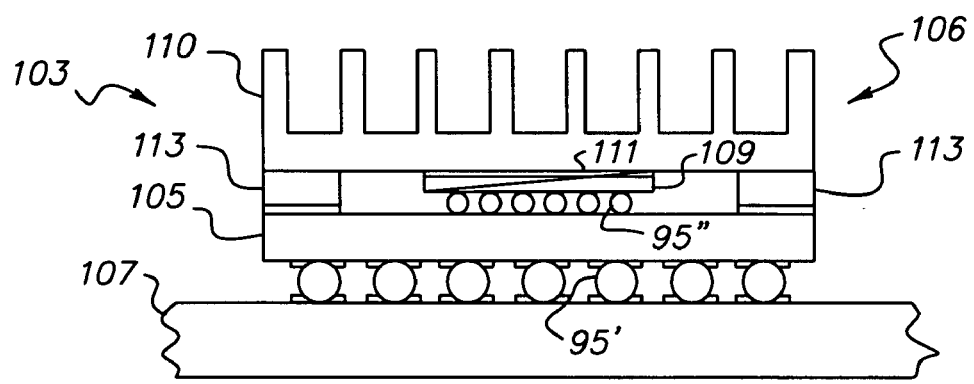
FIG. 7 is a side view of two examples of electrical assemblies which can utilize one or more of the circuitized substrates of the invention.

FIG. 7 represents examples of such circuitized substrate electrical assemblies as taught herein in use within a larger electronic assembly 103. One assembly, referenced by the numeral 105, may form part of a larger chip carrier assembly 106, while the assembly represented by the numeral 107 may be a PCB, designed to have carrier assembly 106 positioned thereon and electrically coupled thereto. Therefore, each of the assemblies as taught herein may function in combination with other such assemblies and thus provide the enhanced conductive paste connections taught herein for a much larger structure. As mentioned above, each assembly includes one or more of the circuitized substrates taught herein. For example, the substrate assembly 105 for carrier 106 may be of the construction of the assembly formed in FIG. 6. In this case, assembly 105 of chip carrier 106 is preferably mounted on and electrically coupled to PCB 107 using a plurality of the aforementioned solder balls 95' (preferably of conventional tin-lead composition), the chip carrier 106 in turn having a semiconductor chip 109 positioned thereon and electrically coupled to the upper portion of assembly 105 using a second plurality of solder balls 95" (also preferably of conventional tin-lead composition). In both cases, the outer pads (i.e., pads 65 on the upper surface of substrate 53) may function as solder pads designed for having a solder ball positioned thereon and reflowed once in position. The upper pads of underlying PCB 107 may provide a similar function to accommodate solder balls 95'. If PCB 107 is of the same or similar construction as the structure of FIG. 6, the upper conductors 65 of substrate 53 may provide this function. The chip carrier assembly 106 may also include a heat sink 110 thermally coupled to the chip 109, e.g., using a thermally conductive paste 111, and positioned on the upper surface of the carrier by appropriate standoffs 113, as is known in the art. It is also within the abilities of those skilled in the art to utilize an encapsulant material (not shown) to substantially encase the chip and also to possibly eliminate the need for the heat sink if such an encapsulant material is used. Encapsulant material is also possible about the lower pluralities of solder balls 95'. It is even further within the scope of the invention to couple chip 109 using conventional wire-bonding in which a plurality of fine wires (not shown) are bonded between chip conductor sites and corresponding conductor pads on the underlying substrate.

Figure 8:
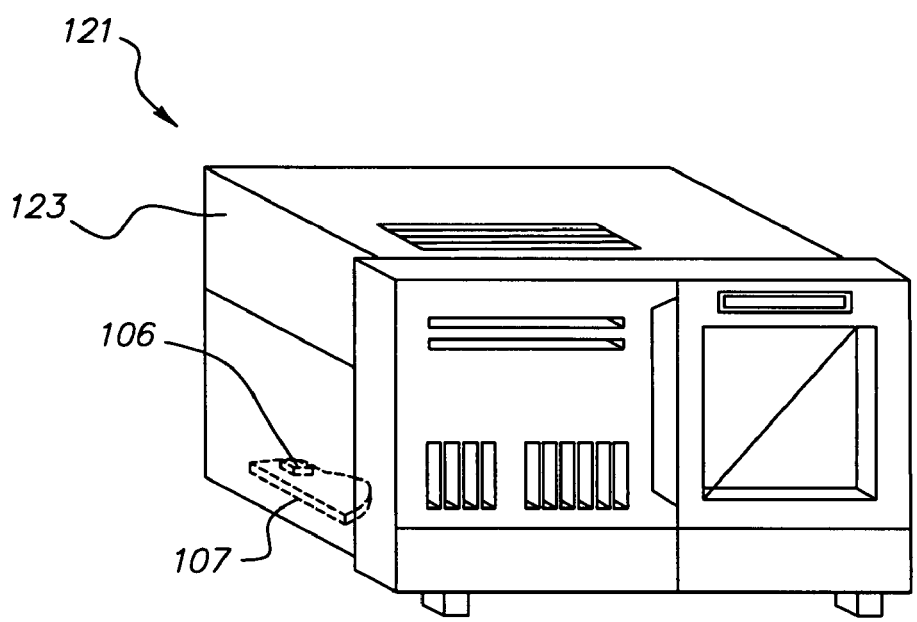
FIG. 8 is a perspective view of an information handling system adapted for using at least one circuitized substrate of the invention.

In FIG. 8, there is shown an information handling system 121 which is preferably a personal computer, a mainframe computer or a computer server. Other types of information handling systems, including well-known products such as cell-phones, televisions, etc. known in the art may also utilize the teachings of this invention. The circuitized substrate assemblies formed in accordance with the teachings herein may be utilized in the system 121 as a PCB 107 (shown hidden) and/or a chip carrier 106 (also shown hidden). The circuitized substrate assemblies may be utilized as a motherboard in system 121 or as one or more individual PCBs typically utilized in such systems. As is known, computer and the like systems 121 are usually contained within a suitable metal or insulative housing such as shown by the numeral 123, with appropriate venting (if desired) therein, as well as instrumentation externally accessible for system operation by the system's designated operator. The remaining elements of information handling systems of these types are known in the art and further description is not believed necessary.

Thus there has been shown and described a circuitized substrate in which highly effective electrical connections are made possible through the use of a new and unique conductive paste formulation which utilizes a metallic component including nano-particles and possibly other metal micro-particles (as well as possibly conducting polymer materials and an organic material such as epoxy resin) as part thereof. The substrates as taught herein include dielectric materials with melting points substantially similar or greater than the sintering and melting points of the conductive paste, to assure sintering and possibly melting will occur as a result of lamination. Various embodiments of such substrates may be combined together to form a larger, multilayered substrate assembly which can be utilized in such electronic structures as information handling systems. Such systems are thus able to benefit by the unique, advantageous features of this invention. Still further, the formation of sintered paste compositions as well as both sintered and melted compositions has resulted in compositions which reduces the resistance of the electrical paths therein, but also the formation of robust and reliable electrical joints.

While there have been shown and described what are at present considered the preferred embodiments of the invention, it will be obvious to those skilled in the art that various changes and modifications may be made therein without departing from the scope of the invention as defined by the appended claims. The invention as defined herein is also capable of transmitting both regular and high speed (frequency) signals, the latter at a rate of from about one Gigabits/sec to about ten Gigabits/second, while substantially preventing impedance disruption. It is also capable of being produced using many conventional PCB processes so as to assure reduced cost and facilitate ease of manufacture. That is, the preferred method for assembling the circuitized substrate of the invention preferably involves the use of conventional lamination equipment and processes as part of the method in which the dielectric layers, having the designated circuitry and/or conductive elements (planes) thereon or within, are "stacked up" in aligned manner with one another and subjected to relatively high pressures and temperatures for defined time periods.

What is claimed is:

1. A circuitized substrate comprising:
   first and second spaced-apart electrically conductive layers;
   at least one partially cured (B-staged) organic dielectric layer including first and second opposing surfaces, said at least one organic dielectric layer positioned substantially between said first and second spaced-apart electrically conductive layers;
   at least one plated opening within said at least one organic dielectric layer and extending from said first spaced-apart electrically conductive layer to said second spaced-apart electrically conductive layer; and
   a quantity of conductive paste positioned within said at least one plated opening, said quantity of conductive paste including at least one metallic component including a plurality of nano-particles and electrically coupling said first and second spaced-apart electrically conductive layers.

2. The circuitized substrate of claim 1 in which said at least one organic dielectric layer is of a material selected from the group of materials consisting of fiberglass-reinforced epoxy resin, polytetrafluoroethylene, polyimide, polyamide, cyanate resin, photo-imageable material and combinations thereof.

3. The circuitized substrate of claim 1 wherein said at least one opening is a thru-hole.

4. The circuitized substrate of claim 1 wherein said metallic component is selected from the group consisting of copper, silver, gold, zinc, cadmium, palladium, iridium, ruthenium, osmium, rhodium, platinum, iron, cobalt, nickel, indium, tin, antimony, lead, bismuth and alloys thereof.

5. The circuitized substrate of claim 1 wherein said quantity of conductive paste positioned within said at least one opening further includes solder particles as part thereof.

6. The circuitized substrate of claim 5 wherein said solder is selected from the group consisting of tin-lead, bismuth-tin, bismuth-tin-iron, tin, tin-silver, tin-gold, tin-silver-zinc, tin-silver-zinc-copper, tin-bismuth-silver, tin-copper, tin-copper-silver, tin-indium-silver, tin-antimony, tin-zinc, tin-zinc-indium, copper-based solders, and alloys thereof.

7. The circuitized substrate of claim 5 wherein said solder particles are of micro-particle size.

8. The circuitized substrate of claim 7 wherein said quantity of conductive paste positioned within said at least one opening further includes a conducting polymer.

9. The circuitized substrate of claim 8 wherein said quantity of conductive paste positioned within said at least one opening further includes an organic material.

10. The circuitized substrate of claim 9 wherein said organic material comprises an epoxy resin.

11. The circuitized substrate of claim 1 wherein said quantity of conductive paste positioned within said at least one opening further includes a second metallic component having particles of micro-particle size.

12. The circuitized substrate of claim 11 wherein said quantity of conductive paste positioned within said at least one opening further includes a conducting polymer.

13. The circuitized substrate of claim 12 wherein said quantity of conductive paste positioned within said at least one opening further includes an organic material.

14. The circuitized substrate of claim 13 wherein said organic material comprises an epoxy resin.

15. The circuitized substrate of claim 1 wherein said quantity of conductive paste positioned within said at least one opening further includes a conducting polymer.

16. The circuitized substrate of claim 15 wherein said quantity of conductive paste positioned within said at least one opening further includes an organic material.

17. The circuitized substrate of claim 1 further including at least one electrical component electrically coupled to said conductive paste, said circuitized substrate and said at least one electrical component forming an electrical assembly.

* * * * *